United States Patent [19]

Rhodes

[11] 4,237,423

[45] Dec. 2, 1980

[54] DIGITAL PHASE DETECTOR

[75] Inventor: Randy D. Rhodes, Frenchtown, N.J.

[73] Assignee: RCA Corporation, New York, N.Y.

[21] Appl. No.: 967,792

[22] Filed: Dec. 8, 1978

[51] Int. Cl.$^3$ .............................................. H03K 5/26
[52] U.S. Cl. .................................... 328/133; 307/232; 328/110
[58] Field of Search ....................... 328/133, 134, 110; 307/232

[56] References Cited

U.S. PATENT DOCUMENTS

| | | | |
|---|---|---|---|
| 3,710,140 | 1/1973 | Volmerange | 328/133 |
| 3,714,463 | 1/1973 | Laune | 307/232 |
| 4,020,422 | 4/1977 | Underhill | 328/133 |
| 4,027,262 | 5/1977 | Sharpe | 328/133 |
| 4,122,405 | 10/1978 | Tietz et al. | 307/232 X |

OTHER PUBLICATIONS

RCA COS/MOS Integrated Circuits–1977 "ICAN-6101" pp. 612–615–FIG. 3.

*Primary Examiner*—John S. Heyman
*Attorney, Agent, or Firm*—Eugene M. Whitacre; Paul J. Rasmussen; Peter M. Emanuel

[57] ABSTRACT

A digital phase detector responsive to input signal transitions of first and second input signals for producing output current pulses of first and second polarities dependent upon whether the first input signal leads or lags the second; the width of the output pulses being proportional to the amount of phase lead or lag.

The phase detector includes two edge triggered bistable circuits for controlling a tri-state current source which provides positive, negative, or zero current depending upon the respective logical states of the bistable circuits. The detector circuit is arranged so that the bistable circuits are placed in the SET state by signal applied to their respective input terminals, provided both bistable circuits are in the RESET state. Each bistable circuit is RESET by pulses supplied from a respective pulse forming circuit. The pulse forming circuit is conditioned by the bistable circuit it drives to be selectively responsive to the input signal being applied to the other bistable circuit.

Only one of the bistable circuits is in the SET state at one time for the two input signals being out of phase. Both bistable circuits simultaneously alternate between SET and RESET states when the input signals are in phase.

4 Claims, 7 Drawing Figures

DIGITAL PHASE DETECTOR

This invention relates to phase detector circuits and in particular to detectors employing digital devices.

Phase detectors compare the relative phase relationship of two signals, e.g., a reference signal and a secondary signal. Typical digital phase detectors combined with a low pass filter provide an output signal where amplitude is related to the phase difference of the input signals.

A common application of the phase detector is in phase locked loop circuitry wherein a locally generated signal is synchronized with a reference signal. The local signal is generated by a voltage controlled oscillator or VCO, controlled by the output signal of the phase detector. The reference signal or a subharmonic thereof is applied to one input of the phase detector and the VCO signal or subharmonic thereof is applied to a second input of the phase detector. For the condition of the two signals being out of phase the detector output will be of such amplitude to cause the VCO to increase or decrease in frequency tending to bring its signal in coincidence with the reference. Once this condition is achieved the phase detector output amplitude is maintained at the requisite amplitude by means of the electronic servo loop.

Basically the required function of the phase detector is to provide positive energy (source current) if the reference signal is higher in frequency than the secondary signal or negative energy (sink current) if the secondary signal is higher in frequency than the reference signal. The amount of energy supplied must be proportioned to the difference in frequency or phase. No energy should be supplied when the two signals match in frequency or phase.

Representative examples of commercially available phase detector circuits of this type are included in RCA Corporation's CD 4046 and Motorola's MC 14568 phase locked loop circuits.

A problem exists with this type of circuit, which is manifested by a non-linearity in the detector output when the phase difference of the two input signals is near zero. This non-linearity is a consequence of mismatch in delays of similar devices used in the two signal paths of the detector circuitry creating a situation similar to a race condition and causing jitter at the output. The present invention minimizes the non-linearity by being responsive only to transitions of the input signals and by minimizing the number of devices in the signal path subject to device delay.

The phase detector of the present invention includes a tri-state current source having first and second control signal input terminals, for providing positive current responsive to signal on its first control terminal, negative current responsive to signal on its second control terminal and zero current otherwise. First and second bistable circuits provide signals to the current source which circuits are placed into set states responsive to transitions of a first sense in a reference signal and in a secondary signal, respectively, providing that both bistable circuits are in the reset state. The second bistable circuit is reset by a first pulse forming circuit responsive to transitions in the first sense of the reference signal conditioned by the second bistable circuit being in its set state; and the first bistable circuit is reset by a second pulse forming circuit responsive to transitions in the first sense of the secondary signal conditioned by the first bistable circuit being in its set state.

Figure 1:
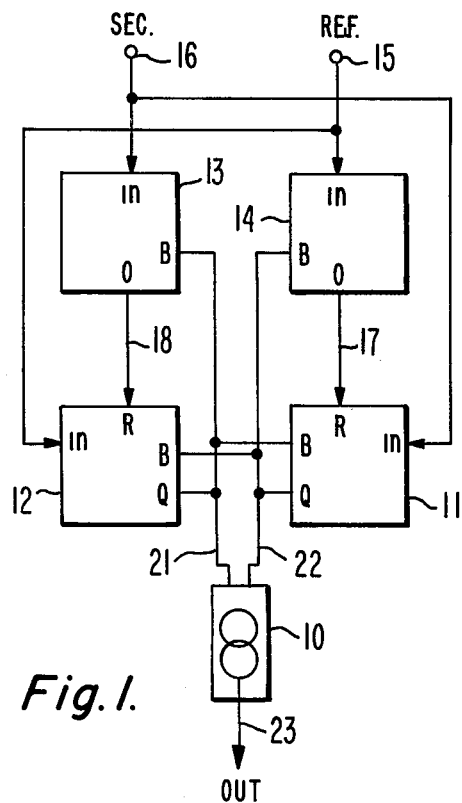
FIG. 1 is a block diagram of the invention.

The circuit of FIG. 1 compares the relative phase of a reference signal with the phase of a secondary signal. The reference signal is applied to set a first bistable circuit 12 for conditioning current source 10 to supply a positive or source current at output terminal 23. The secondary signal is applied to set a second bistable circuit 11 for conditioning current source 10 to provide a negative current—that is, to demand a sink current—at output terminal 23. Whichever signal, reference or secondary, occurs first in time controls the polarity of the output current. A subsequent occurrence of the later signal resets the controlling bistable circuit and terminates the current provided by current source 10. The magnitude of the phase difference is indicated by the duration of the particular output current pulse and the phase relationship of the two signals (leading or lagging) is indicated by the polarity of the output current.

Referring again to the FIG. 1 circuit, the reference signal and secondary signal which are to be compared in phase or frequency are applied to terminals 15 and 16 respectively. The reference signal is routed to the input terminal of pulse forming circuit 14 and further routed to the input terminal of bistable circuit 12. The secondary signal is routed to similar pulse forming and bistable circuits 13 and 11.

Pulse forming circuits 13 and 14 generate pulses responsive to signal transitions of a first sense applied to their input terminals, but do not respond to signal transitions of a second sense opposite to the first. For purposes of description signal transitions of the first sense will be assumed to be positive-going potential transitions, however, they may equally well be negative-going or combinations of positive and negative-going transitions. The output signals from circuits 13 or 14 available on connections 18 and 17 are pulses of duration and polarity sufficient to reset bistable circuits 12 and 11 respectively. Circuits 13 and 14 are prevented from applying output pulses to connections 18 and 17 respectively whenever logic signals or blocking signals are applied to their "B" input terminals. The blocking signals occur whenever the respective bistable circuit 12 or 11 is in the reset state, which signals are present on interconnecting lines 21 and 22. A ramification of this is that neither pulse forming circuit can generate consecutive output signals; rather, they must alternately generate output pulses.

Figure 2:
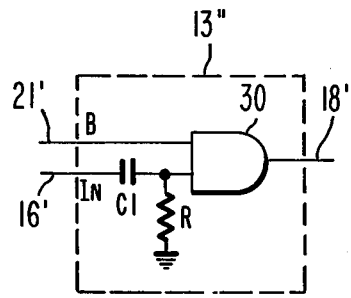
FIG. 2 is a schematic diagram of an embodiment of the pulse forming circuits.

The FIG. 2 circuit is one example of a circuit capable of providing the gated pulse forming function associated with block 13 of FIG. 1. (The primed numerals correspond to the similar unprimed numerals of FIG. 1.) Logical gate 30 is a conventional AND gate for providing a logical high output only during the occurrence of a logical high on both of its input terminals.

Assuming a logic high is present at the B input terminal and a pulse is applied to 16', the pulse will be differentiated by the circuit comprising resistor R and capacitor C and applied to the second input of AND gate 30. The differentiated pulse will have a duration determined by the values of R and C and gate 30 will produce an output pulse at 18' of duration proportional to the resistance value of R times the capacitance value of C. This circuit will only respond to the positive transitions of pulses applied to 16'. Maintaining the potential at terminal B low prevents AND 30 from applying any pulses to terminal 18'.

Bistable circuit 12, and similarly circuit 11, each have two stable states denominated set and reset. In the set state a logical high signal is assumed present at output interconnection 21 and a logical low signal for the reset state. Circuit 12 is responsive to signal transitions applied to its input terminal, IN, to change its logical state from reset to set only and responsive to pulses on its reset terminal R to change its logical state from set to reset only. Circuits 11 and 12 will respond to reset pulses whenever such pulse is applied. However, they are arranged to respond to transitions at their IN terminals only on the condition that both 11 and 12 are in the reset state. This is accomplished by applying the output signals, or their complements, present on interconnection 21 and 22 of one bistable circuit as a "blocking" signal to the other.

Figure 3:
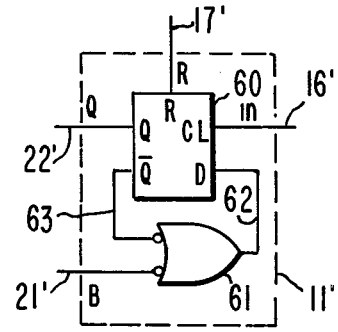
FIG. 3 is one embodiment of a bistable circuit for performing the function of blocks 11 or 12 of FIG. 1.

One particular circuit example of the aforementioned bistable circuit as shown in FIG. 3 utilizes a "D" type flip flop 60 and an OR gate 61 having negated inputs. OR gate 61 applies a logical high signal to the data or D input of flip flop 60 for a logical low signal applied to either or both of its input terminals. Flip flop 60 is of the type which latches the logical signal present on its D input terminal immediately prior to a positive transition on its clock or $C_L$ input terminal, and remains in that state at least until the next succeeding positive signal transition on the $C_L$ input. If a logical high is present at terminal D when a positive transition at $C_L$ occurs, the flip flop is placed in its set state and a logical high is applied at its Q output. The $\overline{Q}$ output of 60 is the complement of Q. Thus for Q high, $\overline{Q}$ is low and 61 is conditioned to apply a logical high to D. Successive signal transitions applied to $C_L$ will have no effect on the state of 60 until it is reset by applying a reset pulse to terminal 17'.

In the reset condition $\overline{Q}$ applies a logical high via connection 63 to OR gate 61. To enable OR gate 61 to apply a further logical high to D via connection 62, a logical low must be present on its second input B, which input is connected via 21' to the $\overline{Q}$ output of its companion circuit, as for example device 12 in FIG. 1. The requirement that the bistable circuit respond to positive transitions at its input terminal conditioned by both bistable circuits being in their reset state is thus realized.

The final element of the FIG. 1 circuit is current source 10. Current source 10 is arranged to provide output current of positive polarity for a logical high applied to a first input control terminal via 21, to provide output current of negative polarity for a logical high applied to a second input control terminal via interconnection 22, and to provide zero current from an essentially infinite source impedance for similar logic states on both its first and second control inputs.

Figure 4:
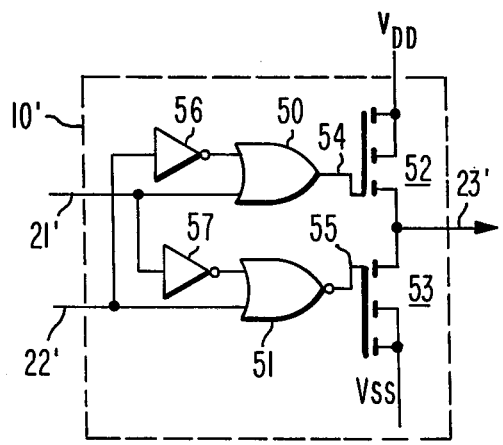
FIG. 4 is a schematic diagram of an embodiment of a tri-state current source.

The FIG. 4 circuit shows one such current source capable of producing a three state output. P-channel enhancement-mode field effect transistor 52 having its source electrode connected to a positive potential source $V_{DD}$ and its drain electrode connected to output terminal 23' sources current conditioned by a logical low potential applied to its gate electrode 54. N-channel enhancement-mode field effect transistor 53 having its source electrode connected to relatively negative potential VSS and its drain electrode connected to output terminal 23' sinks current conditioned by a logical high potential applied to its gate electrode 55. Logic steering circuitry comprising INVERTERS 56 and 57, NOR gate 51 and OR gate 50 applies a low potential at gate electrode 54 only for the condition of a logical high signal on connection 22' and logical low signal on connection 21'. This same logic steering circuitry applies a logical high to gate electrode 55 only for the condition of a logical low signal on connection 22' and a logical high signal on connection 21'. For logical low states on both 21' and 22' or logical high states on both 21' and 22' both transistors 52 and 53 are non-conducting and effectively disconnected from the output at 23'. The circuit of FIG. 4 is presented for illustration only, and current source 10 may be realized by other means.

The phase detector circuit of FIG. 1 has four stable states represented by bistable circuits 11 and 12 being either both set; both reset; 11 set 12 reset; or 11 reset 12 set. The sequence of state changes and circuit operation is shown by the state diagram of FIG. 5. Each of the four circles represents one of the four states. The leftmost numeral in the circles represents the state of bistable circuit 12, numeral "0" indicative of reset and "1" indicative of a set state. Similarly the rightmost numeral represents the state of bistable circuit 11. The arrows between states show the direction of state change for a positive-transition of the particular signal denoted by the attached letter, R (reference) or S (secondary).

For example, if the circuit is assumed in state "10" circuit 12 is set and circuit 11 is reset. This conditions pulse forming circuit 13 to be receptive of a signal at terminal 16 and pulse forming circuit 14 to be blocked by the logic signal applied by the Q output of circuit 11 to the B input of circuit 14. A signal, S, applied to terminal 16 produces a reset pulse in circuit 13, resetting circuit 12 placing the circuit in the "00" state, i.e., both bistable circuits reset. In the "10" state a signal S cannot set circuit 11 since both bistable circuits must be in the reset state for either one to be responsive to an IN signal. Note that, for the condition that both R and S simultaneously go through a positive transition while the circuit is in the "10" state, the same state change occurs. Circuit 12 being in the set state is insensitive to subsequent transitions at its IN terminal until it is reset and circuit 14 cannot provide a reset pulse as it is blocked in the "10" state. The S signal operates as if it were singularly applied. These state changes are designated in the drawing by the upper arrow S/RS between circles "00" and "10" in FIG. 5. In similar fashion all state changes for possible positive transitions are indicated by the diagram.

Figure 6:
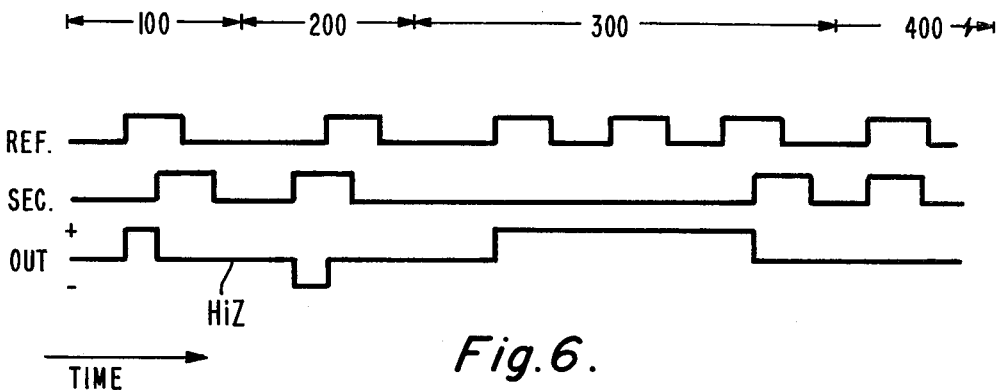
FIG. 6 is an input-output time-current diagram for the FIG. 1 circuit.

FIG. 6 shows a representative circuit response for the FIG. 1 circuit. In the time period 100 the reference signal and the secondary signal lead and lag each other; respectively. The current source 10 provides an output or source current (+) for the period between the positive transition of the reference signal and the first subsequent positive transition of the secondary signal. In the time period denoted 200 the reference signal and the secondary signal lag and lead each other, respectively, and the current source sinks current (−) for the time period between the positive transition of the secondary signal and the first subsequent positive transition of the reference signal. In the time period denoted 300 there exists a widely disparate phase/frequency relationship between reference and secondary signals which difference is indicated by the wide positive current output pulse during this period.

Finally, in the time period denoted 400 the positive-transitions of both signals are coincident effecting no change in the output current. Note the intermediate state of the output current designated Hi Z is to indicate that the current source is providing no current and presenting essentially infinite impedance at its output terminal.

Figure 5:
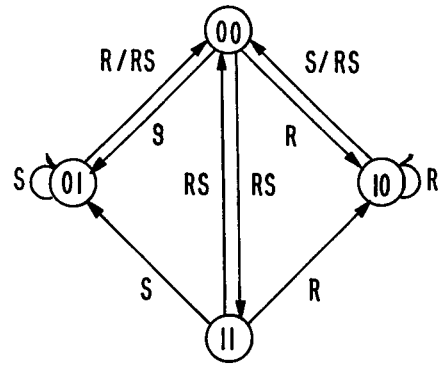
FIG. 5 is a state diagram for the FIG. 1 circuit.
Figure 7:
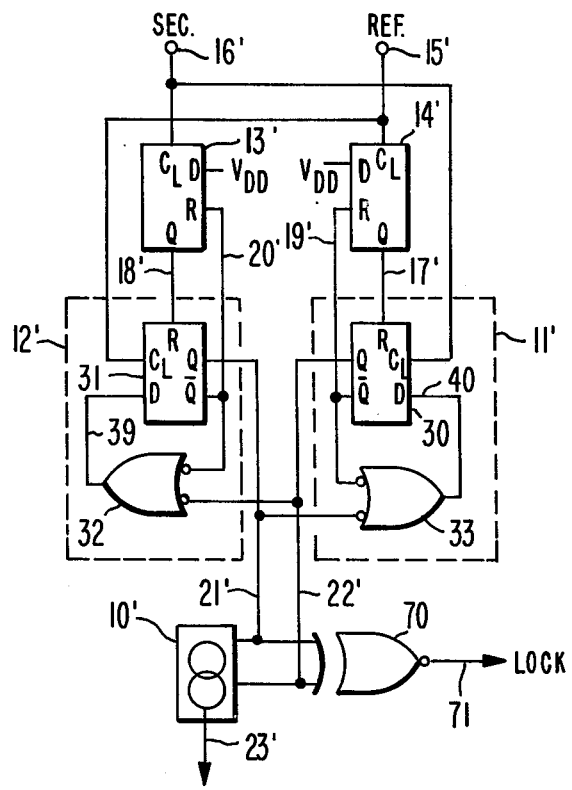
FIG. 7 is a circuit schematic of a further embodiment of the invention.

The FIG. 7 circuit is a further embodiment of the FIG. 1 circuit utilizing the bistable circuits illustrated in FIG. 3 and further providing an output signal which indicates when the input signals are in-phase or locked. The control potentials to tri-state current-source 10' are sensed by exclusive NOR circuit 70 which circuit outputs a logical high potential for similar logic levels on its two inputs and outputs a logic low for dissimilar logic-levels on its inputs. FIG. 5 indicates that when the two input signals are in phase, i.e., their positive signal transitions occur simultaneously, the output states of bistable circuits 11 and 12 controlling current source 10 are similar (this is shown by the transitions between the states denoted "00" and "11"). A logical high level at output terminal 71 of NOR 70 therefore indicates that the reference and secondary signals are inphase.

The FIG. 7 pulse forming circuits 13' and 14' are realized with "D" type flip flops. The data or D input terminals are connected to a point of logic high potential, thus the occurrence of a positive transition at their clock or $C_L$ input terminals will place the flip flop in a set state, i.e., Q output high in the absence of reset signals. The output signal of circuit 14' is connected to reset D flip flop 30 of circuit 11'; and the complementary output, Q, of flip flop 30 is connected to reset flip flop 14'. Assuming bistable 11' to be in the set state, the Q output of flip flop 30 is a logical low; and the potential at its reset terminal must be low, i.e., pulse forming circuit 14' is in a reset state. The potential on the reset terminal R of circuit 14' is a logical low. Application of a positive pulse to terminals 15' sets flip flop 14' which resets flip flop 30 causing a logical high to occur on its Q output, which in turn resets 14' via connection 19'. The pulse generated by circuit 14' is of a duration equal to the time required for flip flop 30 to reset, plus the inherent resetting delay within the flip flop 14'. Aside from the difference in the pulse forming circuit, the overall functional operation of the FIG. 7 circuit is the same as that of the FIG. 1 circuit.

From the foregoing discussion of the invention it is seen that the timing of the control potentials applied to current source 10 via connection 21 and 22 are developed in feed forward signal paths triggered by the transition of the reference or secondary input signals and independent of any feedback loops. The two signal paths are totally independent insofar as signal delays are concerned easing the equalization problem of inherent signal delays in the circuitry to provide simultaneous similar control signals to source 10 for simultaneously occurring input signals.

The specific embodiments illustrated in the drawings are not to be construed to limit the claims. One skilled in the art armed with the foregoing may devise variations on the circuitry without straying from the spirit of the invention.

What I claim is:

1. A digital phase detector comprising:
    means for applying first and second input signals the phase of which is to be compared;
    a current source having first and second control terminals, for providing current of a first polarity in response to a first control signal being present at said first control terminal and to a second control signal being absent at said second control terminal, for providing current of a second polarity in response to said second control signal being present said second control terminal and to said first control signal being absent at said first control terminal, and providing substantially zero current in response to said first and second control signals being simultaneously present at said first and said second control terminals, respectively;
    first and second bistable circuits for providing control signals to said first and second control terminals respectively, and for providing blocking signals; each bistable circuit susceptible of SET and RESET states with the potential corresponding to one of these states supplying said control signals, and the blocking signal being provided in the RESET state; said first and second bistable circuits being induced to the SET state in response to determinable transitions of said first and second input signals respectively conditioned on both bistable circuits being in the reset state, and each bistable circuit being unconditionally RESET upon application of a reset pulse to RESET terminal thereof;
    a first pulse forming circuit for providing reset pulses to the first bistable circuit in response to determinable transitions of the second input signal in the absence of the blocking signal from the first bistable circuit;
    a second pulse forming circuit for providing reset pulses to the second bistable circuit in response to determinable transitions of the first input signal in the absence of the blocking signal from the second bistable circuit.

2. A phase detector as set forth in claim 1 wherein said first and second bistable circuits each comprises:
    a flip flop circuit susceptible of a SET and a RESET state, having a first output terminal from which said control signal is available, a RESET terminal for applying said RESET pulses, a clock terminal for applying said input signal, a second output terminal for providing output signal complementary to the control signal and a DATA input terminal; which flop flop circuit, upon application of a signal to its clock input terminal applies and latches the logic signal present on its DATA input terminal immediately preceding the clock input signal, as the logic signal at the first output terminal; and
    further logic circuitry having an output connection for providing signal to said DATA input, and having first and second input terminals for applying blocking signal and said complementary output signal from said flip flop respectively, said logic circuitry providing an output signal having a SET potential value provided a RESET potential value is applied to at least one of its input terminals.

3. A phase detector as set forth in claims 1 or 2 wherein said first and second pulse forming circuits each comprise a flip flop circuit of the type having a DATA input terminal, a clock input terminal and an OUTPUT terminal wherein the logical potential present at the DATA input terminal immediately prior to application of a signal to the clock input terminal is transferred to and latched at said OUTPUT terminal in response to a signal transition at said clock input terminal; said flip flop further having a RESET input terminal for application of blocking pulses and wherein the effects of said clock and data signals applied to said flip flop are subordinated to signal applied to said RESET terminal; and means for applying respective input signal to said clock input terminal and means for applying an output signal available at said OUTPUT terminal as reset signal to the respective bistable circuit.

4. A digital phase detector comprising:

first and second terminals for applying first and second input signals;

first, second, third and fourth D type bistable circuits susceptible of SET and RESET states each having a CLOCK, a RESET and a DATA input terminal and an output terminal;

said third and fourth D type circuits each having a further output terminal for providing signal complementary to the signal available from said output terminal;

first and second logical OR circuits each having an output terminal and first and second negated input terminals;

current source means having first and second control terminals for receiving first and second control signals respectively, which means providing a current of a first polarity responsive to the first control signal, providing a current of a second polarity in response to the second control signal and providing substantially zero current for similar control signals occurring simultaneously on its first and second control terminals;

means connecting the output terminals of said first and second D type circuits respectively to the RESET terminals of the third and fourth D type circuits;

means connecting the output terminal of said third D type circuit to the first control terminal of said current source and the first negated input terminal of said second OR circuit;

means connecting the output terminal of said fourth D type circuit to the second control terminal of said current source and the first negated input terminal of said first OR circuit;

means connecting the further output terminal of said third D type circuit to the RESET terminal of said first D type circuit and to the second negated input of the first OR circuit;

means connecting the further output terminal of said fourth D type circuit to the RESET terminal of said second D type circuit and to the second negated input of the second OR circuit;

means connecting the output terminals of the first and second OR circuits to the DATA input terminals of the third and fourth D type circuits respectively;

means connecting the first terminal to the CLOCK terminal of said second and third D type circuits;

means connecting the second terminal to the CLOCK terminal of the first and fourth D type circuits; and means connecting the DATA terminals of the first and second D type circuits to a source of SET potential.

* * * * *

UNITED STATES PATENT AND TRADEMARK OFFICE
CERTIFICATE OF CORRECTION

PATENT NO. : 4,237,423
DATED : December 2, 1980
INVENTOR(S) : Randy D. Rhodes

It is certified that error appears in the above—identified patent and that said Letters Patent is hereby corrected as shown below:

Column 3, line 42, "Q" (second occurrence) should be --$\bar{Q}$--.

Column 3, line 43, "Q" (third occurrence) should be --$\bar{Q}$--.

Column 3, line 48, "Q" should be --$\bar{Q}$--.

Column 5, line 30, "inphase" should be --in-phase--.

Column 5, line 39, "Q" should be --$\bar{Q}$--.

Column 5, line 41, "Q" should be --$\bar{Q}$--.

Column 5, line 47, "Q" should be --$\bar{Q}$--.

Column 6, line 33, after "to" insert --a--.

Signed and Sealed this

Twenty-first Day of April 1981

[SEAL]

Attest:

RENE D. TEGTMEYER

Attesting Officer        Acting Commissioner of Patents and Trademarks